United States Patent

Coker et al.

[15] 3,658,582

[45] Apr. 25, 1972

[54] COMPOSITES, OF IIB-VIA BINARY FILM COMPOUNDS ON IIA-VIIA BINARY COMPOUND SUBSTRATE CRYSTALS AND PROCESS THEREFOR

[72] Inventors: Jesse E. Coker, Orange County; Guido Galli, Alameda County, both of Calif.

[73] Assignee: North American Rockwell Corporation

[22] Filed: Apr. 13, 1970

[21] Appl. No.: 27,579

[52] U.S. Cl. ........................117/201, 117/106 R, 117/106 A, 252/62.3 ZT, 252/62.3ZB

[51] Int. Cl. ..........................................H01l 3/00, H01l 7/34

[58] Field of Search ..........................117/201, 106 R, 106 A; 252/62.32 T

[56] References Cited

UNITED STATES PATENTS

| | | | |
|---|---|---|---|
| 3,409,464 | 11/1968 | Shiozawa | 117/201 |
| 3,433,686 | 3/1969 | Marinace | 117/106 X |
| 3,472,685 | 10/1969 | Marfaing et al. | 117/201 |

*Primary Examiner*—William L. Jarvis
*Attorney*—L. Lee Humphries, H. Fredrick Hamann, Edward Dugas and Martin E. Gerry

[57] ABSTRACT

A composite of a substrate crystal is disclosed having a compound of the JQ type formulation where J is at least one element of group II*a* and Q is at least one element of group VIIa having a film compound formed on the substrate which is of the JQ type formulation where J is at least one element of the group II*b* and Q is at least one element of the group VI*a*. The process for making these composites shows simple and easily controllable steps and provides criteria for obtaining desired film thickness at relatively rapid deposition rates.

7 Claims, 3 Drawing Figures

INVENTORS
JESSE E. COKER
GUIDO GALLI
BY
Martin E. Kerry
AGENT

INVENTORS
JESSE E. COKER
GUIDO GALLI
BY
Martin E. Gerry
AGENT

COMPOSITES, OF IIB-VIA BINARY FILM COMPOUNDS ON IIA-VIIA BINARY COMPOUND SUBSTRATE CRYSTALS AND PROCESS THEREFOR

BACKGROUND OF INVENTION

1. Field of Invention

This invention relates to composites and process for making these composites, which are utilized in solid state electronics particulary related to photoconductivity materials that comprise binary compound films on binary substrate crystals.

2. Prior Art

There has been considerable interest in recent years in the development of epitaxial films of semiconductor materials on sapphire substrates for solid state electronic device applications. To present time the materials most frequently studied have included silicon, germanium and more recently gallium arsenide. Earlier studies were conducted on the epitaxy of tungsten on sapphire. Recently epitaxial evaporation of copper films on sapphire was accomplished. All these materials belong to cubic crystal classes. The increased interest in films of piezoelectric materials for microwave applications prompted a study of the epitaxy of such materials.

SUMMARY OF THE INVENTION

The invention uses substrate crystals of predetermined crystallographic orientations which are prepolished for deposition thereon of a film material so as to form or deposit a film on the polished surface under controlled deposition rates by controlling the temperature differentials between the film material and the substrate crystal, by reducing the pressure in the reactor used for this process and by controlling the flow rates of an ambient gas or gases in laminar flow across the substrate crystal and the film material. The types of film materials, substrate crystals used, the temperatures and temperature differentials and the types of ambient gas or gases used are hereinbelow enumerated.

Some advantages of using closely spaced film materials with substrate surface include the capability of:

Depositing of II*b*–VI*a* material with good qualities, that has good Hall mobility.

Depositing of films on a substrate surface allows formation of a variety of semiconductor devices.

Depositing a variety of semiconductor devices on the same substrate surface.

Deposited films can be polished to desired flatness and used in producing the requisite planar films with the specified degree of flatness precision.

Microwave device fabrication is facilitated by utilizing semiconductor films. Fabrication of better piezoelectric materials, large-scale integrated circuits or photoelectric devices are also made possible.

Other advantages of the process hereinbelow described resides in the capability of growing relatively thick films of the order of 5,000A. to 4 mils or thicker depending on the materials used and also depending on the thickness of the substrate crystal. This implies that the films may be within the range of thickness stated and also the substrate crystal may have a thickness of 1 mil or greater.

EXEMPLARY EMBODIMENT

Figure 1:
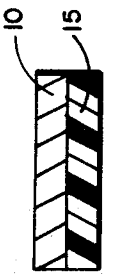
FIG. 1 is a cross-section view of the composite showing the film attached to the substrate as provided by the process steps of this invention.

Referring to FIG. 1, compositions of film compounds 10 are prepared usually by deposition thereof on insulating substrate material 15.

Film compounds are used having a JQ formulation, where J is at least one element selected from group II*b* elements such as zinc, cadmium or mercury, and where Q is at least one element selected from group VIa elements such as oxygen, sulfur, selenium, telleruium and polonium.

Substrate crystals with crystallographic plane orientations such as (100) or (111) are used for deposition of the film compound on a polished surface thereof, the substrate crystal being a compound having a JQ formulation, where J is at least one element selected from group IIa elements such as beryllium, magnesium, calcium, strontium, barium, and radium, and Q is at least one element selected from group VII*a* such as fluorine, chlorine, bromine, iodine and astatine.

The film and substrate crystal compounds will usually be monocrystalline in structure due to epitaxial deposition of the film material on the substrate crystal.

The film JQ binary materials and the substrate JQ binary materials used including typical crystallographic planes of the substrates are given in table 1, below as follows:

TABLE 1 - FILMS AND SUBSTRATES

| Layer JQ Formulation | | Substrate Crystal Such As Having (100) or (111) Crystallographic Plane Orientations of the JQ Formulation | |
|---|---|---|---|
| J Elements (IIb) | Q Elements (VIa) | J Elements (IIa) | Q Elements (VIIa) |
| zinc | oxygen | beryllium | fluorine |
| cadmium | sulfur | magnesium | chlorine |
| mercury | selenium | calcium | bromine |
| | tellurium | strontium | iodine |
| | polonium | barium | astatine |
| | | radium | |

Figure 2:
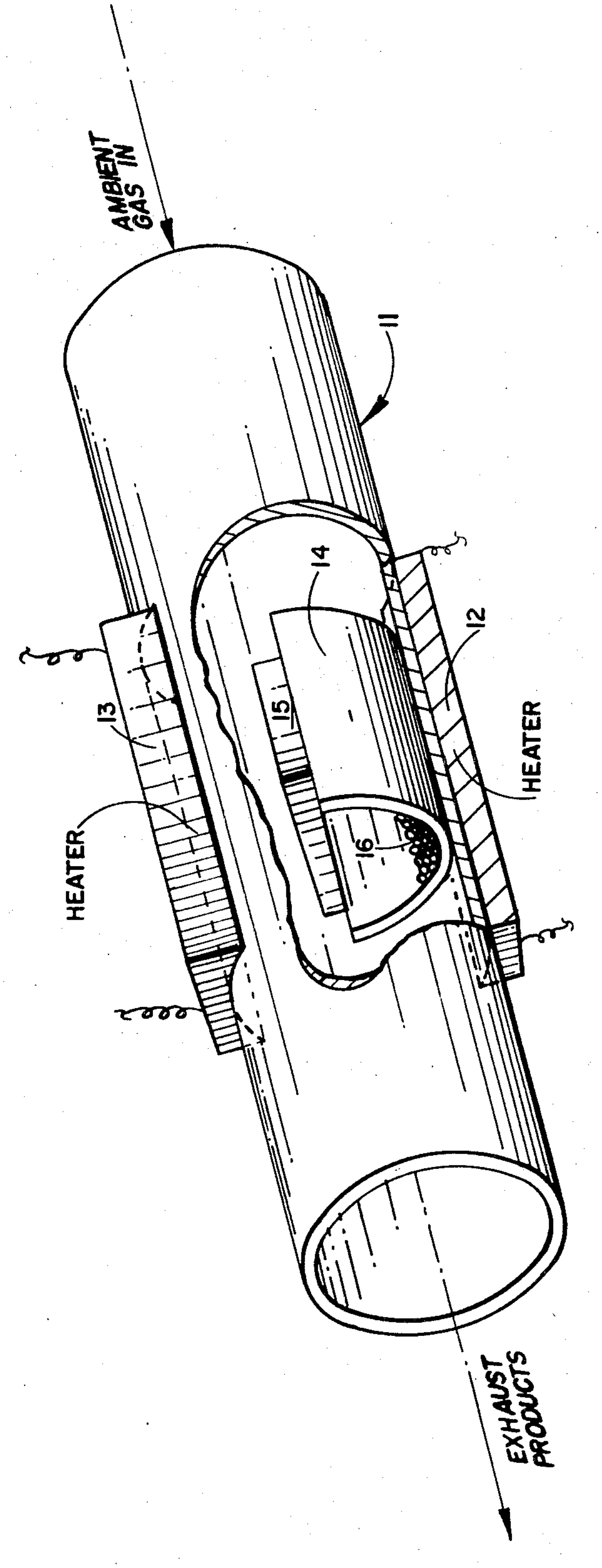
FIG. 2 is a perspective view of the reactor showing the manner in which the film material and the substrate crystal is positioned for execution of the deposition process.
Figure 3:
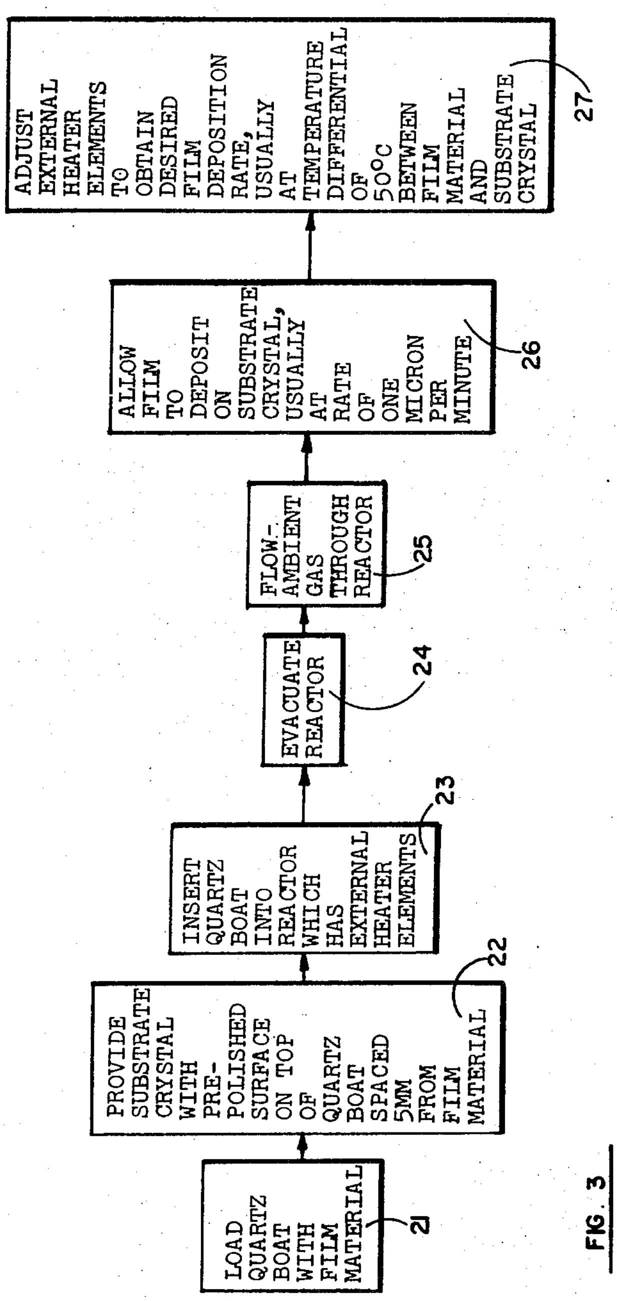
FIG. 3 is a flow diagram enumerating the steps of the process defined by this invention.

Referring to FIGS. 2 and 3, the method of making the composite is by deposition of film compound material on a polished substrate crystal surface.

Horizontal reactor 11, generally made of a cylindrical quartz tube, has electrically controllable heaters 12 and 13 affixed externally thereto on the lower and upper surface of the cylinder. The heaters are adjusted so that generally a 50° C. differential is maintained between the lower and upper portions of the reactor during deposition of the film on the substrate. A quartz boat 14 is inserted in the reactor, with a substrate crystal or crystals 15 positioned on top of the boat with the polished surface of the substrate crystal facing the bottom of the quartz boat, and the bottom of the quartz boat contains the above-stated film compound. Substrate crystals which were cut to a specific crystallographic orientation and polished, had been cleaned and dried. The film compound material 16 is separated from the polished surface of substrate crystal 15 by about 5 millimeters. The quartz boat positioning in reactor with the substrate and film materials are as shown at 21, 22 and 23 in the flow diagram, indicating the sequence of steps.

The reactor, which is a closed system during the evacuation as at 24, to a pressure lower than atmospheric pressure and may be as low as $10^{-4}$ Torr, in order to permit injection and flow of at least one of the ambient gases which is introduced into the reactor at one end thereat, at a pressure of about one atmosphere, as at 25. The ambient gas is at least one gas selected from the group consisting of hydrogen, helium, argon and hydrogen chloride. Exhaust apertures of the closed loop reactor system are provided at the other end of the reactor tube so that the ambient gas may be continuously circulated through the reactor during the process, and additionally in a laminar flow manner.

The hydrogen and/or the hydrogen chloride gas may be used for providing transportation of the heated film material to the substrate crystal surface. The helium and/or argon gases may be combined with the hydrogen and/or hydrogen chloride gases to reduce the rate of transport of the film material. Generally, the temperature of the film source material 16 will be approximately 50°C higher than the temperature of the substrate crystal 15 as stated in table 2 below for enabling deposition of the film material to occur on the substrate crystal surface. Radiant heaters 12 and 13 located outside the reactor are adjusted so as to provide the requisite temperatures and temperature differentials between the film and substrate materials as at 26.

After reaching the desired deposition temperature which for certain film materials may be anywhere between 200°C and 1,000°C, where hydrogen chloride gas is also used, the hydrogen chloride gas may be introduced so as to be between 0.1 percent and 20 percent of the total gas concentration.

The proper spacing between film source material 16 and substrate crystal surface 15, the proper temperature differentials therebetween and the flow of the ambient gas or gases thereacross maintained during the deposition process, will cause the source material 16 to deposit as a film 10 on the polished or lower surface of substrate crystal 15, as shown at 27 in a layer of desired thickness until the desired film thickness is obtained.

With these conditions the film growth rate will generally be 1-micron per minute, although faster or slower growth rates may be obtained by increasing or decreasing the temperature differential between bottom and top of reactor tube, by varying electrical power applied to these heaters, depending on the film material used, by varying the spacing between the film material and substrate surface, and/or by varying the quantity of hydrogen chloride gas used.

The heaters and ambient gas flow are then shut off, and the quartz boat removed with the deposited film 10 on the substrate surface 15 to yield the composite desired.

A table of typical film and substrate materials and temperatures at which these materials are maintained are given as follows:

TABLE 2 - TYPICAL FILM AND SUBSTRATE DEPOSITION TEMPERATURES

| Film Compound | Substrate Compound | Film Material Temperature °C. | Substrate Temperature °C. |
|---|---|---|---|
| CdS | $CaF_2$ | 650° | 600 |
| CdSe | $CaF_2$ | 600 | 550 |
| CdS | $BeF_2$ | 650° | 600 |

An example illustrating the reaction occurring to form a cadmium sulfide film on the substrate crystal during the step of heating the substrate crystal and the cadmium sulfide source material to maintain about a 50°C temperature differential therebetween, when the ambient gas is injected in the reactor, is approximately expressed by the following equation:

In the above equation, the HCl and $H_2$ constitute the ambient gas. The reaction caused by the introduction of the ambient gases and the heating causes the intermediate formation of $CdCl_2$ and $H_2S$ in the vapor phase of the reaction. Exhaust products will be in the form of HCl and $H_2$. Since the inner surface of the reactor near the exhaust end is cooler than where the substrate is located, some cadmium followed by $CdCl_2$ will be deposited at the exhaust end rather than at the center of the reactor, where the substrate is located, thereby assuring deposition of the desired film compound on the substrate rather than deposition of the intermediate products formed by the reaction.

We claim:

1. A composite comprising in combination:

a substrate crystal compound of the JQ formulation wherein J is at least one element selected from the group consisting essentially of group II*a* elements and Q is at least one element selected from the group consisting of group VII*a* elements; and a film compound on at least a portion of said substrate crystal of the JQ formulation wherein J is at least one element selected from the group consisting of group II*b* elements, and Q is at least one element selected from the group consisting of group VIa elements.

2. The composite as stated in claim 1, wherein: said film compound is monocrystalline.

3. The composite as stated in claim 1, wherein: said substrate crystal is monocrystalline.

4. A process for making the composition as stated in claim 1, wherein a film material for providing the JQ film compound is positioned in a reactor in spaced relationship to the substrate crystal, comprising the steps of:

evacuating said reactor to a predetermined internal pressure which is lower than atmospheric pressure;

flowing at least one ambient gas through said reactor and across the film material and substrate crystal; and controlling the temperature of the film material and substrate crystal to a predetermined temperature differential therebetween thereby depositing said film material on a surface of said substrate crystal at a predetermined rate of deposition to form said film compound of a predetermined thickness on said substrate crystal.

5. The process as stated in claim 4, wherein:

the predetermined internal pressure is at least $10^{-4}$ Torr.

6. The process as stated in claim 4, wherein:

the temperature differential is about 50° C.

7. The process as stated in claim 4, wherein:

the predetermined rate of deposit is about 1-micron per minute.

* * * * *